(12) United States Patent
Yamashita et al.

(10) Patent No.: US 11,244,872 B2
(45) Date of Patent: Feb. 8, 2022

(54) FINFET COMPLEMENTARY METAL-OXIDE-SEMICONDUCTOR (CMOS) DEVICES

(71) Applicant: INTERNATIONAL BUSINESS MACHINES CORPORATION, Armonk, NY (US)

(72) Inventors: Tenko Yamashita, Schenectady, NY (US); Chen Zhang, Albany, NY (US); Teresa Jacqueline Wu, Rexford, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/849,279

(22) Filed: Apr. 15, 2020

(65) Prior Publication Data

US 2021/0327769 A1  Oct. 21, 2021

(51) Int. Cl.

| | |
|---|---|
| *H01L 21/8238* | (2006.01) |
| *H01L 21/28* | (2006.01) |
| *H01L 29/66* | (2006.01) |
| *H01L 29/06* | (2006.01) |
| *H01L 29/49* | (2006.01) |
| *H01L 29/78* | (2006.01) |
| *H01L 27/092* | (2006.01) |

(52) U.S. Cl.
CPC ........ *H01L 21/823885* (2013.01); *H01L 21/28088* (2013.01); *H01L 21/823814* (2013.01); *H01L 21/823842* (2013.01); *H01L 21/823878* (2013.01); *H01L 27/092* (2013.01); *H01L 29/0653* (2013.01); *H01L 29/4966* (2013.01); *H01L 29/66553* (2013.01); *H01L 29/66666* (2013.01); *H01L 29/7827* (2013.01)

(58) Field of Classification Search
CPC ....... H01L 21/823885; H01L 21/28088; H01L 21/823814
See application file for complete search history.

(56) References Cited

U.S. PATENT DOCUMENTS

| | | | |
|---|---|---|---|
| 7,691,701 B1 | 4/2010 | Belyansky et al. | |
| 9,356,027 B1 | 5/2016 | Cheng et al. | |
| 9,484,427 B2 | 11/2016 | Ando et al. | |
| 9,515,164 B2 | 12/2016 | Ando et al. | |

(Continued)

*Primary Examiner* — Errol V Fernandes
(74) *Attorney, Agent, or Firm* — Tutunjian & Bitetto, P.C.; Robert Sullivan

(57) ABSTRACT

A method of fabricating a complementary metal-oxide-semiconductor device is provided. The method includes forming a work function material layer segment on a gate dielectric layer over a first vertical fin and a bottom spacer layer on an n-type bottom source/drain adjoining the first vertical fin on a first region of a substrate, wherein the gate dielectric layer is also over a second vertical fin, bottom spacer layer on a p-type bottom source/drain adjoining the second vertical fin on a second region. The method further includes heat treating the work function material layer segment to produce a modified work function material layer segment on the first vertical fin with a shifted work function value, forming a second work function material layer on the modified work function material layer segment and the gate dielectric layer on the second vertical fin, and growing a top source/drain on each of the vertical fins.

15 Claims, 7 Drawing Sheets

(56) References Cited

U.S. PATENT DOCUMENTS

| | | |
|---|---|---|
| 9,799,656 B2 | 10/2017 | Bao et al. |
| 10,014,391 B2 | 7/2018 | Bergendahl et al. |
| 10,043,900 B1 * | 8/2018 | Bi ........................ H01L 29/785 |
| 10,176,997 B1 | 1/2019 | De Silva et al. |
| 10,249,533 B1 | 4/2019 | Shearer et al. |
| 10,297,668 B1 * | 5/2019 | Lee ................. H01L 21/823487 |
| 2018/0174922 A1 * | 6/2018 | Chiu ................. H01L 29/66795 |
| 2019/0131396 A1 | 5/2019 | Zhang et al. |
| 2019/0221483 A1 | 7/2019 | Mulfinger et al. |

* cited by examiner

FINFET COMPLEMENTARY METAL-OXIDE-SEMICONDUCTOR (CMOS) DEVICES

BACKGROUND

The present invention generally relates to fin field effect transistors (FinFETs) forming complementary metal-oxide-semiconductor (CMOS) devices, and more particularly to CMOS devices having gate structures with work function material layers.

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a MOSFET with a single gate parallel with the plane of the substrate. Depending on the doping of the source and drain, an n-FET or a p-FET can be formed. Two FETs also can be coupled to form a complementary metal oxide semiconductor (CMOS) device, where a p-channel MOSFET and n-channel MOSFET are coupled together.

SUMMARY

In accordance with an embodiment of the present invention, a method of fabricating a complementary metal-oxide-semiconductor (CMOS) device is provided. The method includes forming a work function material layer segment on a gate dielectric layer over a first vertical fin and a bottom spacer layer on an n-type bottom source/drain adjoining the first vertical fin on a first region of a substrate, wherein the gate dielectric layer is also over a second vertical fin and the bottom spacer layer on a p-type bottom source/drain adjoining the second vertical fin on a second region of the substrate. The method further includes heat treating the work function material layer segment to produce a modified work function material layer segment on the first vertical fin with a shifted work function value. The method further includes forming a second work function material layer on the modified work function material layer segment and the gate dielectric layer on the second vertical fin, and growing a top source/drain on each of the first vertical fin and the second vertical fin.

In accordance with another embodiment of the present invention, a method of fabricating a complementary metal-oxide-semiconductor (CMOS) device is provided. The method includes forming an n-type bottom source/drain adjoining a first vertical fin on a first region of a substrate and a p-type bottom source/drain adjoining a second vertical fin on a second region of the substrate, wherein there is an isolation region in the substrate between the first vertical fin and the second vertical fin. The method further includes depositing a bottom spacer layer on the n-type bottom source/drain and p-type bottom source/drain by selective deposition, wherein there is a gap between the bottom spacer layer on the n-type bottom source/drain and the bottom spacer layer on the p-type bottom source/drain. The method further includes depositing a gate dielectric layer on the bottom spacer layer, first vertical fin, and second vertical fin, and forming a work function material layer segment on the first vertical fin. The method further includes heat treating the work function material layer segment to produce a modified work function material layer segment on the first vertical fin with a shifted work function value. The method further includes forming a second work function material layer on the modified work function material layer segment and the gate dielectric layer on the second vertical fin, and growing a top source/drain on each of the first vertical fin and the second vertical fin.

In accordance with yet another embodiment of the present invention, a complementary metal-oxide-semiconductor (CMOS) device is provided. The CMOS device includes an n-type bottom source/drain adjoining a first vertical fin on a first region of a substrate, and a p-type bottom source/drain adjoining a second vertical fin on a second region of the substrate. The CMOS device further includes a bottom spacer layer on the n-type bottom source/drain and p-type bottom source/drain, and a gate dielectric layer on the bottom spacer layer, first vertical fin, and second vertical fin. The CMOS device further includes a modified work function material layer segment on the first vertical fin, and a second work function material layer on the modified work function material layer segment and the gate dielectric layer on the second vertical fin. The CMOS device further includes a top source/drain on each of the first vertical fin and the second vertical fin.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide modified work function materials for gate structures on n-type fin field effect transistor devices, while providing unmodified work function materials on p-type fin field effect transistor devices. Use of a heat treatment to modify the work function material layer on a vertical fin forming an n-type fin field effect transistor device can modify the work function to be closer to the conduction band of a semiconductor channel material, for example, silicon, thereby having a target threshold voltage of an n-type transistor device.

Embodiments of the present invention provide a method of forming a modified work function material layer as a gate structures on an n-type fin field effect transistor device, while providing an unmodified work function materials on p-type fin field effect transistor devices. A portion of a first work function material layer can be heat treated on a vertical fin forming an n-type fin field effect transistor device, and a second work function material layer can be formed on a gate dielectric layer forming a gate structures on a p-type fin field effect transistor device after the heat treatment.

Embodiments of the present invention provide adjacent n-type fin field effect transistor devices and p-type fin field effect transistor devices with different work functions on the same substrate. The adjacent n-type fin field effect transistor devices and p-type fin field effect transistor devices can form complementary metal-oxide-semiconductor (CMOS) devices on the same substrate using the electrically joined work function material layers to couple the gate structures.

Embodiments of the present invention provide a method of heat treating a work function material layer to adjust the work function for an n-type fin field effect transistor device, while providing an unadjusted work function for a p-type fin field effect transistor device.

Exemplary applications/uses to which the present invention can be applied include, but are not limited to: logic devices (e.g., NAND gates, NOR gates, XOR gates, etc.), memory devices (e.g., static random access memory (SRAM)), application specific integrated circuits (ASICs), microcontrollers, CMOS BIOS chips, etc.

It is to be understood that aspects of the present invention will be described in terms of a given illustrative architecture; however, other architectures, structures, substrate materials and process features and steps can be varied within the scope of aspects of the present invention.

Figure 1:
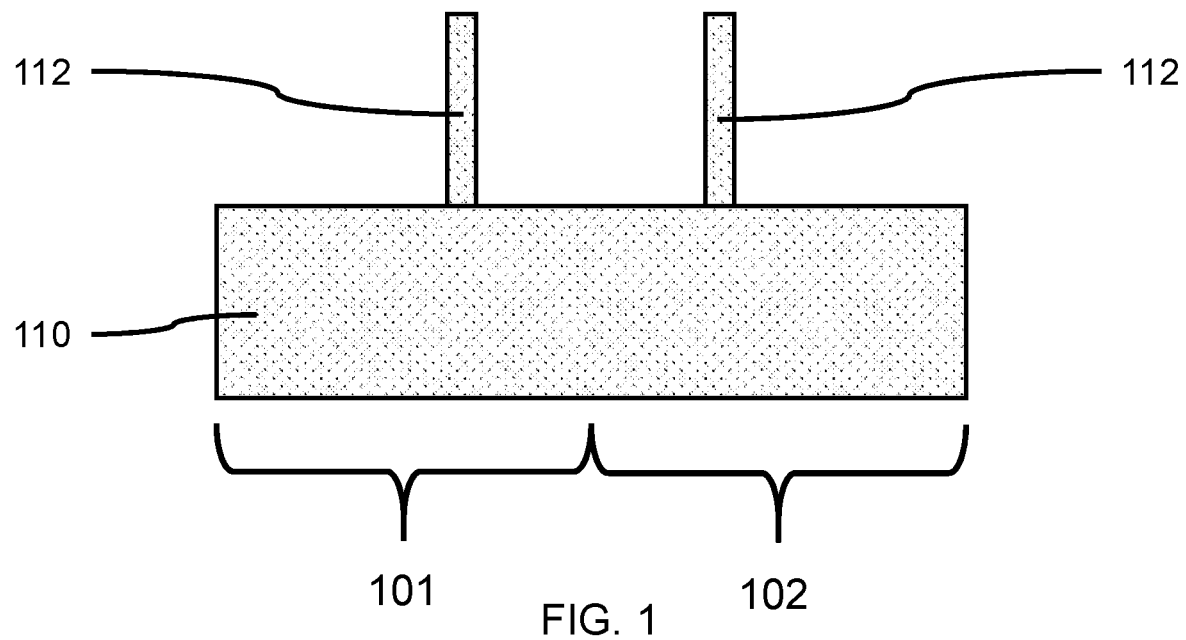
FIG. 1 is a cross-sectional side view showing a plurality of vertical fins on a substrate, in accordance with an embodiment of the present invention.

Referring now to the drawings in which like numerals represent the same or similar elements and initially to FIG. 1, a cross-sectional side view of a plurality of vertical fins on a substrate is shown, in accordance with an embodiment of the present invention.

In one or more embodiments, a plurality of vertical fins 112 can be formed on a substrate 110, where the vertical fins can be formed by lithographic techniques and etching. In various embodiments, the vertical fins 112 can be formed from the substrate 110 by a sidewall image transfer process, including, but not limited to, self-aligned double patterning (SADP), self-aligned triple patterning (SATP), and self-aligned quadruple patterning (SAQP). In various embodiments, the vertical fins 112 can be formed by masked and/or direct write lithographic processes, for example, extreme ultraviolet lithography (EUV), e-beam lithography, laser lithography, ion beam lithography, and combinations thereof. The vertical fins 112 can be formed from a vertical fin layer formed on the substrate, for example, by epitaxial growth and/or layer transfer methods (e.g., Epitaxial Liftoff Processes (ELO), Smart-Cut®, etc.).

In various embodiments, the vertical fins 112 can have a width in a range of about 4 nanometers (nm) to about 15 nm, or about 5 nm to about 10 nm, or about 6 nm to about 8 nm, although other widths are also contemplated.

In various embodiments, the vertical fins 112 can have a height in a range of about 20 nm to about 100 nm, or about 25 nm to about 80 nm, or about 30 nm to about 60 nm, although other heights are also contemplated.

In one or more embodiments, the substrate 110 can be a semiconductor substrate (e.g., a monolithic semiconductor wafer) or a semiconductor-on-insulator (SeOI) substrate, including, an active semiconductor surface layer, a buried insulator layer, and a carrier or support layer. One or more semiconductor devices can be formed on or in the substrate 110.

In various embodiments, the substrate 110 can include a semiconductor material, including, but not limited to, a group IV semiconductor (e.g., silicon (Si), germanium (Ge), a compound IV-IV semiconductor (e.g., silicon-germanium (SiGe), silicon carbide (SiC), a compound III-V semiconductor (e.g., gallium-arsenide (GaAs), gallium nitride (GaN), indium phosphide (InP), Indium gallium nitride (InGaN), aluminum gallium phosphide (AlGaP), etc.), a compound II-VI semiconductor (e.g., zinc selenide (ZnSe), zinc oxide (ZnO), cadmium sulfide (CdS), cadmium telluride (CdTe), etc.), and combinations thereof.

In one or more embodiments, a vertical fin 112 can be formed on a first region 101 of the substrate 110 and another vertical fin 112 can be formed on a second region 102 of the substrate 110, where the first region 101 of the substrate can be adjoining or adjacent to the second region 102 of the substrate. Adjacent vertical fins 112 may have no other intervening vertical fins between them. Adjoining regions 101, 102 of the substrate can share a common boundary. Adjacent regions 101, 102 of the substrate 101 may have an intervening isolation region (e.g., a shallow trench isolation (STI) feature dividing the adjacent regions, but no other intervening semiconductor regions.

Figure 2:
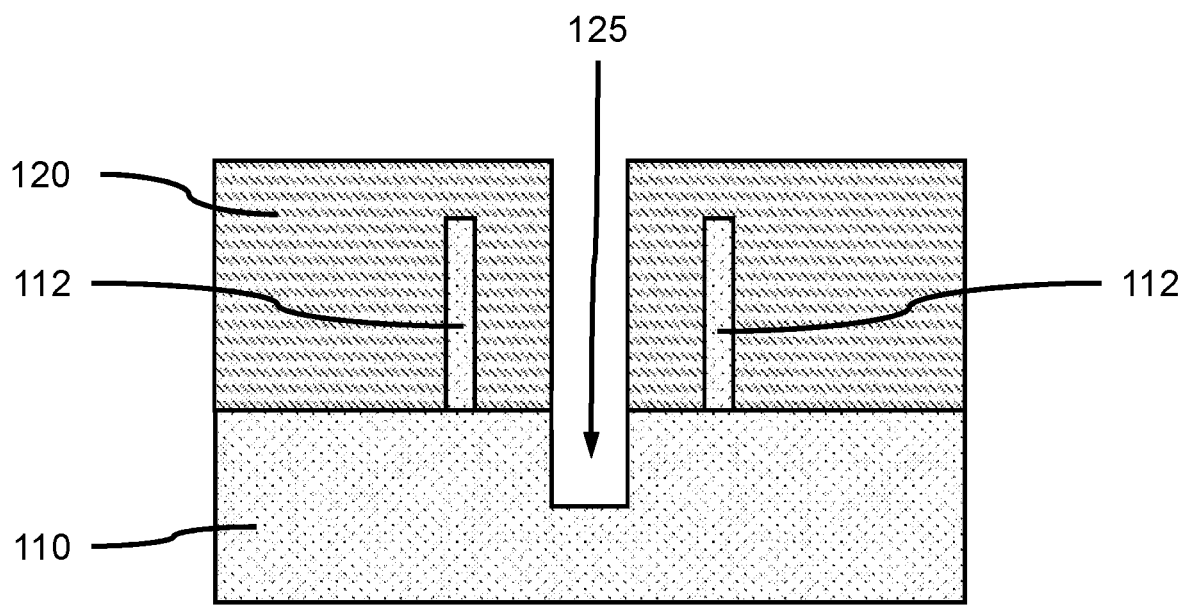
FIG. 2 is a cross-sectional side view showing a cover layer formed on the plurality of vertical fins, and a trench formed between two adjacent vertical fins, in accordance with an embodiment of the present invention.

FIG. 2 is a cross-sectional side view showing a cover layer formed on the plurality of vertical fins, and a trench formed between two adjacent vertical fins, in accordance with an embodiment of the present invention.

In one or more embodiments, a cover layer 120 can be formed on the substrate 110 and vertical fin(s) 112, where the cover layer can be formed by a blanket deposition, for example, chemical vapor deposition (CVD), plasma enhanced CVD (PECVD), physical vapor deposition (PVD), a spin-on process, or a combination thereof. The cover layer 120 can cover the tops of the vertical fins 112.

In various embodiments, the cover layer 120 can be a dielectric material, including, but not limited to, silicon oxide (SiO), silicon nitride (SiN), silicon oxynitride (SiON), silicon boro carbonitride (SiBCN), and combinations thereof.

In one or more embodiments, one or more trenches 125 can be formed through the cover layer 120 and into a portion of the substrate 110, where the trench(es) 125 can be formed by a lithographic process and a directional etch, for example, a reactive ion etch (RIE). The trench can extend a predetermined distance into the substrate 110 to subsequently form an isolation region.

In various embodiments, a trench 125 can be a distance from a sidewall of a vertical fin in a range of about 10 nm to about 60 nm, or about 20 nm to about 50 nm, although other depths are also contemplated. The separation distance can provide space for subsequently formed gate structures on the vertical fin(s) 112.

In various embodiments, the trench(es) 125 can have a depth into the substrate 110 in a range of about 20 nm to about 60 nm, or about 30 nm to about 50 nm, although other depths are also contemplated.

Figure 3:
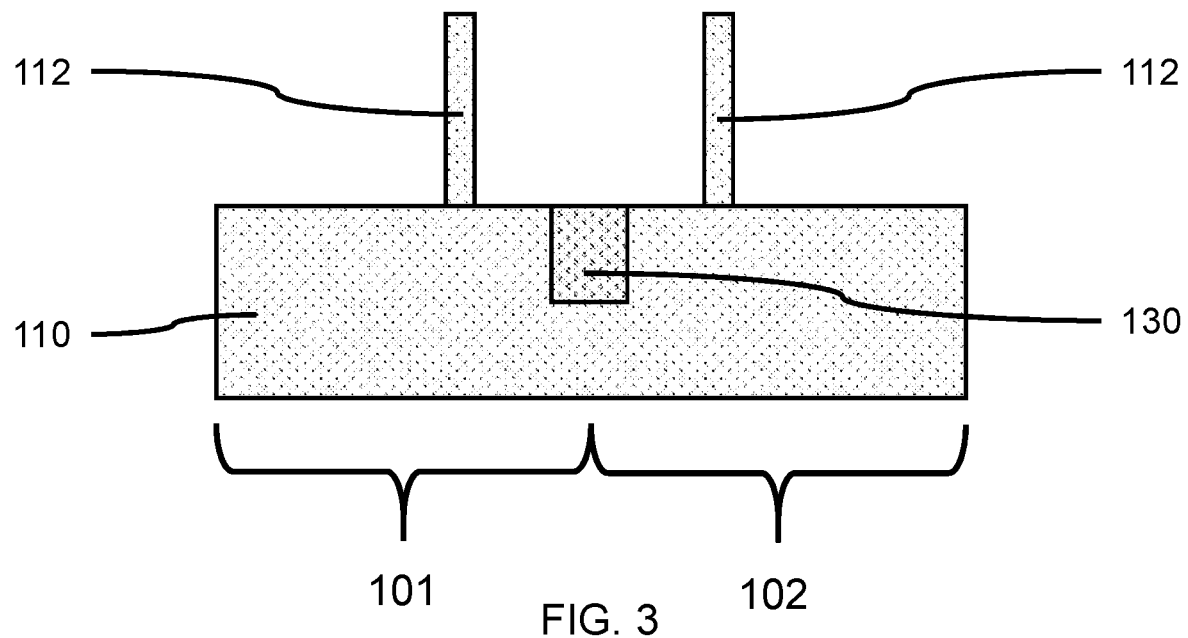
FIG. 3 is a cross-sectional side view showing an isolation region formed in the substrate between the two adjacent vertical fins, in accordance with an embodiment of the present invention.

FIG. 3 is a cross-sectional side view showing an isolation region formed in the substrate between the two adjacent vertical fins, in accordance with an embodiment of the present invention.

In one or more embodiments, an isolation region 130 can be formed in the substrate 110 by forming an electrically insulating dielectric material in the trench(es) 125. The electrically insulating dielectric material can be formed in the trench(es) 125 by a conformal deposition, for example, atomic layer deposition (ALD), plasma enhanced ALD (PEALD), a blanket deposition, for example, CVD, PECVD, PVD, flowable oxide, spin-on, or a combination thereof. The isolation region 130 may or may not include a void space depending on the deposition process(es).

In various embodiments, the isolation region 130 can be an electrically insulating dielectric material, including, but not limited to, silicon oxide (SiO), silicon nitride (SiN), silicon oxynitride (SiON), silicon boro carbonitride (SiBCN), a flowable oxide, a low-k dielectric material, and combinations thereof. The low-k dielectric materials can be carbon-doped silicon oxide (SiO:C), fluorine doped silicon oxide (SiO:F), carbon-based polymeric materials (OPL), silicon based polymeric dielectric materials, for example, hydrogen silsesquioxane (HSQ) and methylsilsesquioxane (MSQ), tetraethoxysilane (TEOS), and combinations thereof. The isolation region 130 can be a different dielectric material from the cover layer 120 to allow selective removal of the cover layer 120.

In one or more embodiments, the electrically insulating dielectric material in the trench(es) 125 can be recessed to the top surface of the substrate 110. The cover layer 120 can be removed using a selective isotropic etch, for example, a wet chemical etch, a dry plasma etch, or a combination thereof, to expose the underlying vertical fins 112 and substrate surface.

Figure 4:
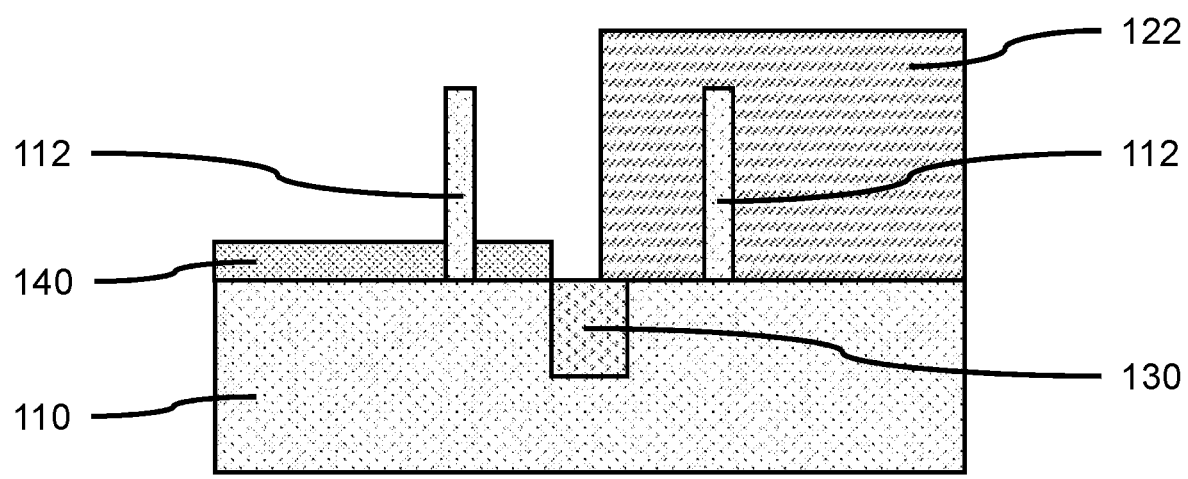
FIG. 4 is a cross-sectional side view showing a first bottom source/drain formed on the substrate adjoining one of the plurality of vertical fins, in accordance with an embodiment of the present invention.

FIG. 4 is a cross-sectional side view showing a first bottom source/drain formed on the substrate adjoining one of the plurality of vertical fins, in accordance with an embodiment of the present invention.

In one or more embodiments, a first region 101 or a second region 102 of the substrate can be covered by a first shielding segment 122, where the first shield segment can be formed by patterning a shield layer using lithography and etching. The other of the first region 101 or second region 102 of the substrate surface can be exposed. A portion of the isolation region 130 can be covered by the first shielding segment 122, which can compensate for variations in the lithography process. In various embodiments, the shielding layer and first shielding segment 122 can be a dielectric material (e.g., hard mask), lithographic resist material (e.g., soft mask), or a combination thereof.

In one or more embodiments, a first bottom source/drain 140 can be formed on the exposed region of the substrate 110, for example, the first region 101. The first bottom source/drain 140 can be formed, for example, by expitaxial growth on the surface of the substrate 110, where the first bottom source/drain 140 can be an n-doped semiconductor maternal (e.g., with phosphorus (P), arsenic (As), or a combination) to form an n-type fin field effect transistor or p-doped semiconductor material (e.g., with boron (B), gallium (Ga), or a combination) to form a p-type fin field effect transistor. The doping can be in situ (i.e., during epitaxial growth), ex situ (i.e., not during epitaxial growth), or a combination thereof. The expitaxial growth would not form a first bottom source/drain 140 on the dielectric material of the isolation region 130.

In various embodiments, the first bottom source/drain 140 can have a thickness in a range of about 5 nm to about 20 nm, or about 10 nm to about 15 nm, although other thicknesses are also contemplated. The first bottom source/drain 140 can adjoin a lower portion of a vertical fin 112 on the first region 101 of the substrate 110.

Figure 5:
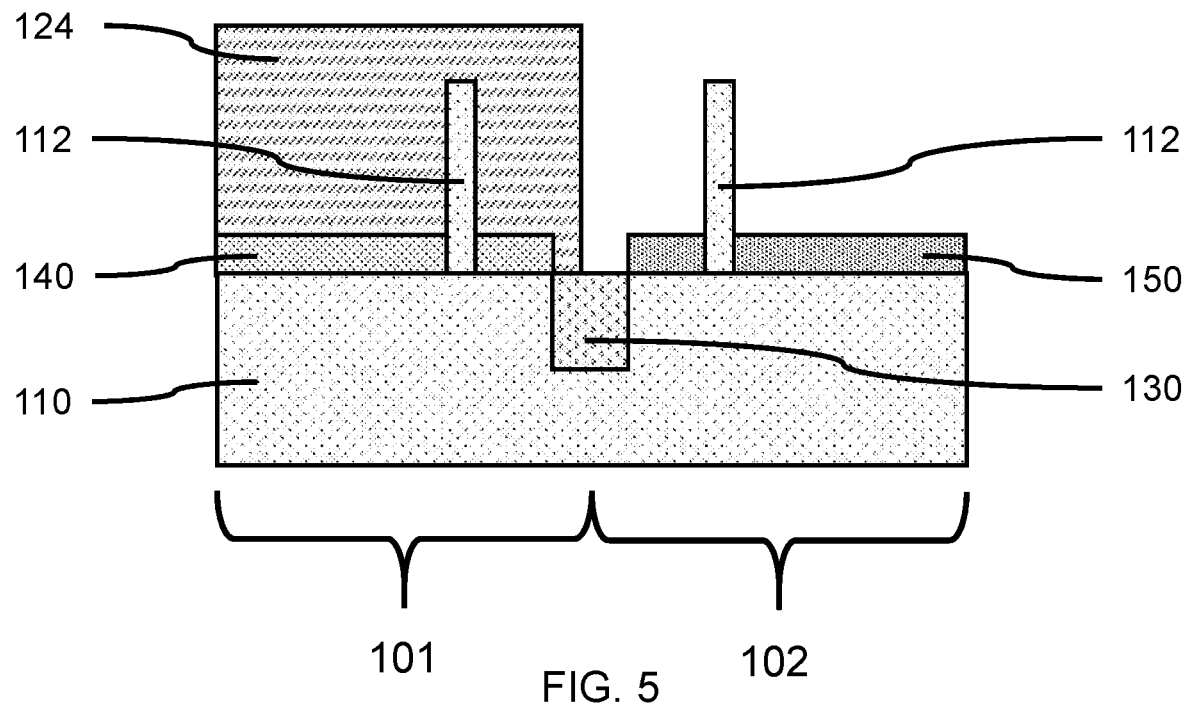
FIG. 5 is a cross-sectional side view showing a second bottom source/drain formed on the substrate adjoining the adjacent one of the plurality of vertical fins, in accordance with an embodiment of the present invention.

FIG. 5 is a cross-sectional side view showing a second bottom source/drain formed on the substrate adjoining the adjacent one of the plurality of vertical fins, in accordance with an embodiment of the present invention.

In one or more embodiments, the first shielding segment 122 and any remaining portions of the shield layer can be removed, for example, with a selective isotropic etch (e.g., wet chemical or dry plasma), to expose the underlying surface of the substrate. A second shield layer can be formed on the substrate and patterned using lithography and etching to form a second shield segment 124 on the first bottom source/drain 140 and, for example, first region 101 of the substrate. The second shield layer and second shield segment 124 can be a dielectric material (e.g., hard mask), lithographic resist material (e.g., soft mask), or a combination thereof.

In one or more embodiments, a second bottom source/drain 150 can be formed on the exposed region of the substrate 110, for example, the first region 101. The second bottom source/drain 150 can be formed, for example, by expitaxial growth on the surface of the substrate 110, where the second bottom source/drain 150 can be n-doped semiconductor material to form an n-type fin field effect transistor or p-doped semiconductor material to form a p-type fin field effect transistor. The doping can be in situ, ex situ, or a combination thereof. The dopant type of the second bottom source/drain 150 can be the opposite of the first bottom source/drain 140 to provide for fabricating a CMOS device.

In various embodiments, the second bottom source/drain 150 can have a thickness in a range of about 5 nm to about 20 nm, or about 10 nm to about 15 nm, although other thicknesses are also contemplated. The second bottom source/drain 150 can adjoin a lower portion of a vertical fin 112 on the second region 102 of the substrate 110.

Figure 6:
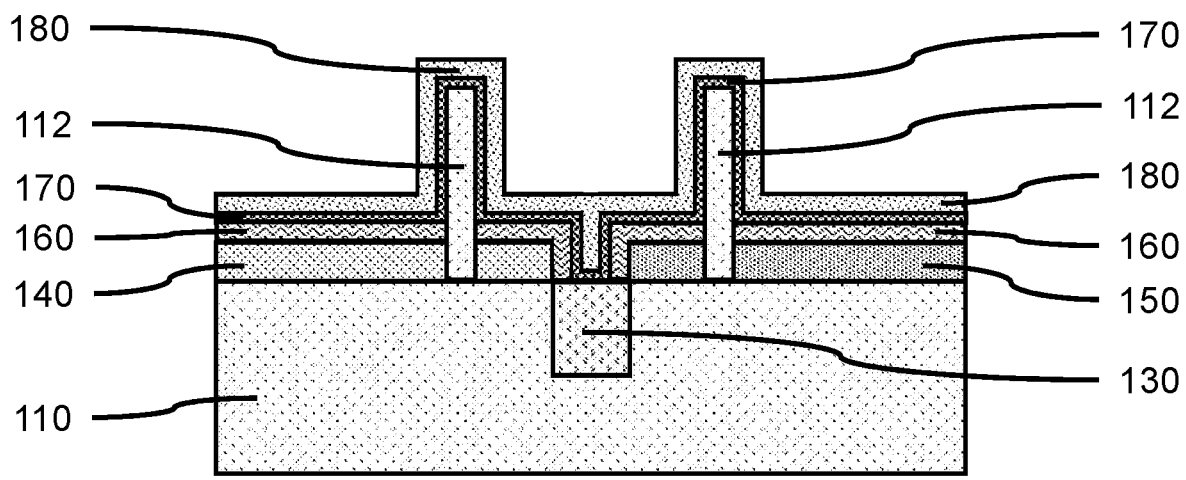
FIG. 6 is a cross-sectional side view showing a bottom spacer on each of the bottom source/drains, and a gate dielectric layer and first work function material layer on the bottom spacers and vertical fins, in accordance with an embodiment of the present invention.

FIG. 6 is a cross-sectional side view showing a bottom spacer on each of the bottom source/drains, and a gate dielectric layer and first work function material layer on the bottom spacers and vertical fins, in accordance with an embodiment of the present invention.

In one or more embodiments, a bottom spacer 160 can be formed on each of the bottom source/drains 140, 150, where the bottom spacer 160 can be formed by a selective deposition on the semiconductor material of the exposed surfaces of the bottom source/drains 140, 150. The selective deposition can form the bottom spacer 160 on the exposed top surfaces and sidewalls of the first bottom source/drain 140 and second bottom source/drain 150, where the portion of the bottom spacer 160 on the sidewalls of the bottom source/drains 140, 150 can extend over a portion of the isolation region 130.

In various embodiments, the bottom spacer 160 can have a thickness in a range of about 5 nm to about 20 nm, or about 10 nm to about 15 nm, although other thicknesses are also contemplated. The bottom spacer 160 can have a thickness that fills in the gap between the first bottom source/drain 140 and second bottom source/drain 150, or a section of the isolation region 130 can remain exposed between the bottom spacers 160 on adjacent bottom source/drains.

In various embodiments, the bottom spacer 160 can be formed by a directional deposition, for example, a gas cluster ion beam (GCIB) deposition, high density plasma (HDP) deposition, directional sputter deposition, or a combination thereof. An isotropic etch-back can be used to remove deposited material from the sidewalls of the vertical fins 112.

In one or more embodiments, the bottom spacers 160 can be an electrically insulating dielectric material, including, but not limited to, silicon oxide (SiO), silicon nitride (SiN), silicon oxynitride (SiON), a low-k dielectric, or a combination thereof. The low-k dielectric materials can be carbon-doped silicon oxide (SiO:C), fluorine doped silicon oxide (SiO:F), carbon-based polymeric materials (OPL), silicon based polymeric dielectric materials, for example, hydrogen silsesquioxane (HSQ) and methylsilsesquioxane (MSQ), tetraethoxysilane (TEOS), and combinations thereof.

In one or more embodiments, a gate dielectric layer 170 can be formed on the exposed surfaces of bottom source/drains 140, 150, isolation region 130, and vertical fins 112, where the gate dielectric layer 170 can be formed by a conformal deposition (e.g., ALD, PEALD). In various embodiments, the gate dielectric layer 170 can cover the top surface of the isolation region 130 exposed between the bottom spacers 160 on the bottom source/drains, and the sidewalls of the bottom spacers 160.

In various embodiments, the gate dielectric layer 170 can be a dielectric material, including, but not limited to hafnium oxide (HfO), hafnium silicon oxide (HfSiO), hafnium silicon oxynitride (HfSiON), and combinations thereof. The high-k material may further include dopants such as lanthanum, aluminum, magnesium, or combinations thereof.

In various embodiments, the gate dielectric layer 170 can have a thickness in a range of about 1 nm to about 3 nm, or about 2 nm, although other thicknesses are also contemplated.

In one or more embodiments, a first work function material layer 180 can be formed on the gate dielectric layer 170, where the first work function material layer 180 can be formed by a conformal deposition (e.g., ALD, PEALD). The first work function material layer 180 and gate dielectric layer 170 can cover the upper portions of the vertical fins 112 above the bottom source/drains 140, 150.

In one or more embodiments, the first work function material layer 180 can be titanium nitride (TiN), titanium aluminum nitride (TiAlN), tantalum nitride (TaN), a carbide, including but not limited to titanium carbide (TiC), titanium aluminum carbide (TiAlC), tantalum carbide (TaC), and combinations thereof. In various embodiments, a conductive material or a combination of multiple conductive materials can serve as both gate conductor and WFM layer.

In various embodiments, the first work function material layer 180 can have a thickness in a range of about 3 nm to about 20 nm, or about 5 nm to about 10 nm, although other thicknesses are also contemplated.

Figure 7:
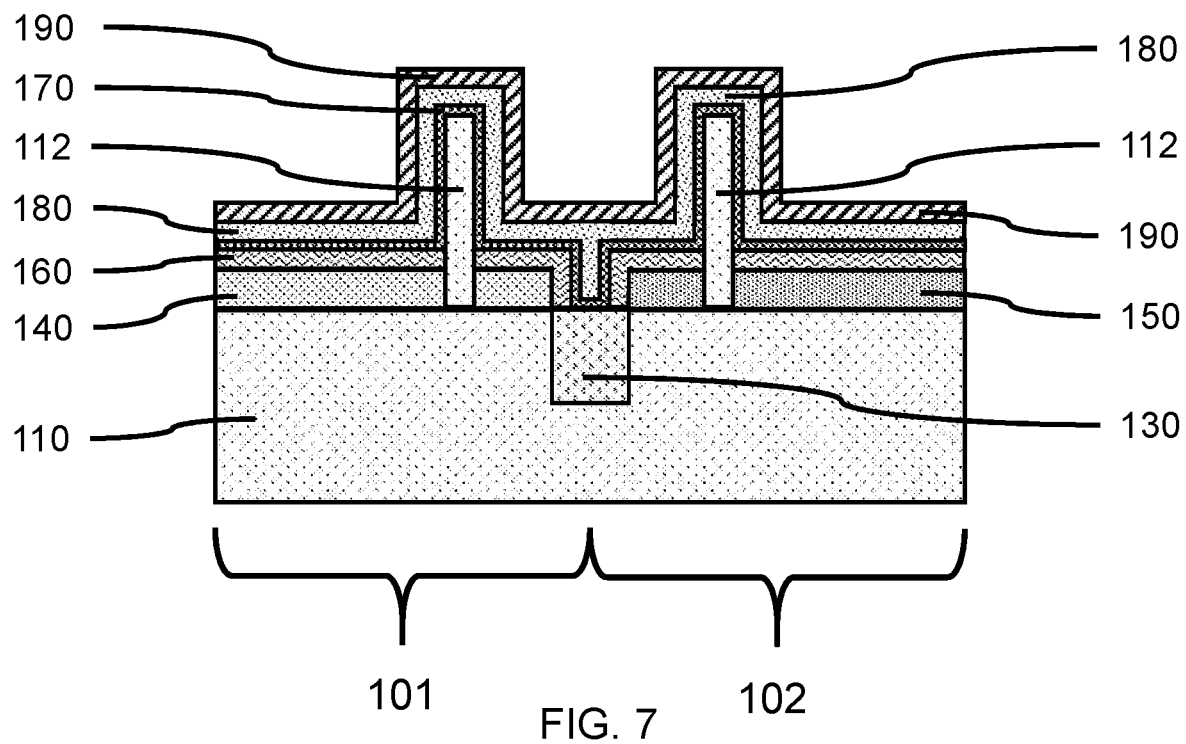
FIG. 7 is a cross-sectional side view showing a capping layer on the first work function material layer, in accordance with an embodiment of the present invention.

FIG. 7 is a cross-sectional side view showing a capping layer on the first work function material layer, in accordance with an embodiment of the present invention.

In one or more embodiments, a capping layer 190 can be formed on the first work function material layer 180, where the capping layer 190 can be formed by a conformal deposition.

In various embodiments, the capping layer 190 can be silicon nitride (SiN), silicon boronitride (SiBN), silicon carbonitride (SiCN), silicon boro carbonitride (SiBCN), and combinations thereof. The capping layer 190 can cover and protect the underlying work function material layer 180 from degradation during a subsequent heat treatment, where the capping layer 190 can act as a diffusion barrier.

In various embodiments, the capping layer 190 can have a thickness in a range of about 50 nm to about 200 nm, or about 100 nm to about 150 nm, although other thicknesses are also contemplated.

Figure 8:
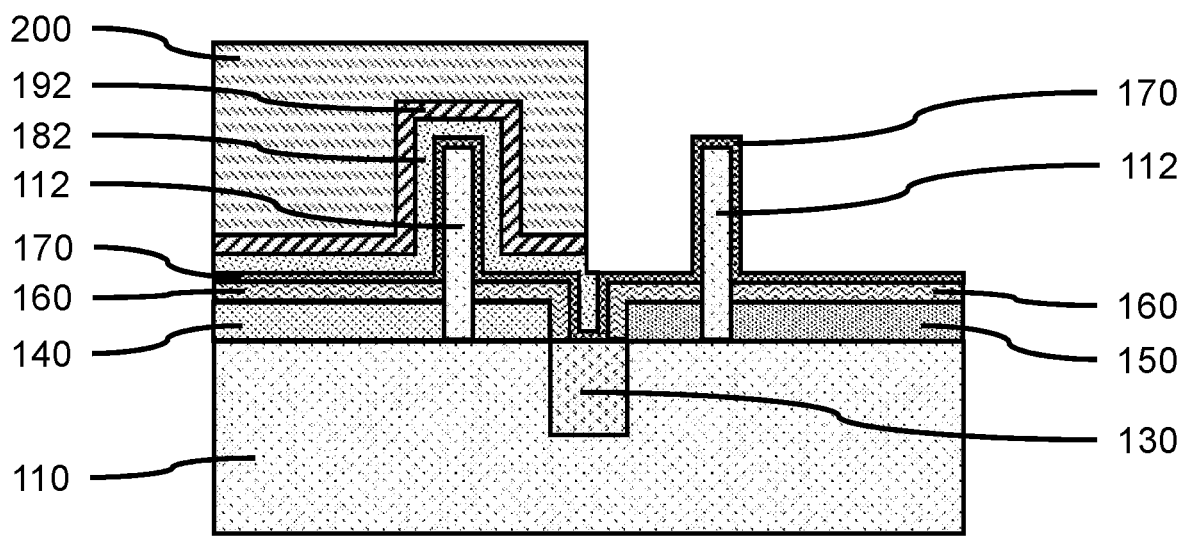
FIG. 8 is a cross-sectional side view showing a masking block on a vertical fin and overlying portion of the capping layer in a first region of the substrate, and an exposed portion of the capping layer and work function material layer removed from the gate dielectric layer and vertical fin in a second region of the substrate, in accordance with an embodiment of the present invention.

FIG. 8 is a cross-sectional side view showing a masking block on a vertical fin and overlying portion of the capping layer in a first region of the substrate, and an exposed portion of the capping layer and work function material layer removed from the gate dielectric layer and vertical fin in a second region of the substrate, in accordance with an embodiment of the present invention.

In one or more embodiments, a masking block 200 can be formed on one or more vertical fin(s) 112 and the overlying portion of the capping layer 190, for example, in a first region 101 of the substrate 110. In various embodiments, the masking block 200 can be formed by patterning a masking layer using lithography and etching. The portion of the capping layer 190 on the second region 102 of the substrate surface can be exposed. In various embodiments, the masking layer and masking block 200 can be a dielectric material (e.g., hard mask), lithographic resist material (e.g., soft mask), or a combination thereof.

In one or more embodiments, the portion of the capping layer 190 exposed in the second region 102 can be removed using a selective, isotropic etch (e.g., wet chemical etch, dry plasma etch), while leaving a capping layer segment 192 in the first region 101. Removal of the portion of the capping layer 190 can expose the underlying portion of the first work function material layer 180 in the second region 102.

In one or more embodiments, the exposed portion of the first work function material layer 180 can be removed using a selective, isotropic etch (e.g., wet chemical etch, dry plasma etch), while leaving a work function material layer segment 182 in the first region 101. Removal of the exposed portion of the first work function material layer 180 can expose the underlying portion of the gate dielectric layer 170. The gate dielectric layer 170 can act as an etch stop for removal of the first work function material layer 180. In various embodiments, a portion of the first work function material layer 180 can remain in a gap between the bottom spacers 160 on the sidewalls of the bottom source/drains 140, 150. The gate dielectric layer 170 can be between the first work function material layer 180 in the gap and the isolation region 130.

Figure 9:
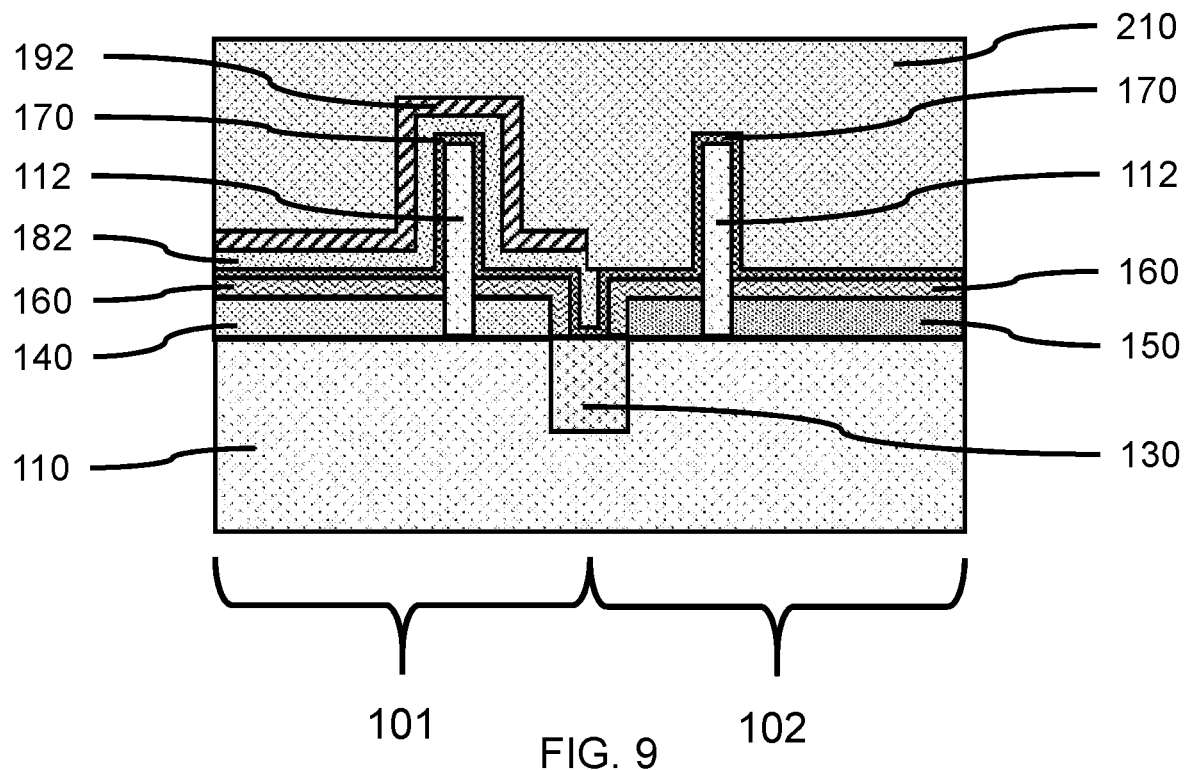
FIG. 9 is a cross-sectional side view showing a protective layer on the remaining portion of the capping layer in the first region of the substrate, after removing the masking block, and on the gate dielectric layer on the vertical fin in the second region of the substrate, in accordance with an embodiment of the present invention.

FIG. 9 is a cross-sectional side view showing a protective layer on the remaining portion of the capping layer in the first region of the substrate, after removing the masking block, and on the gate dielectric layer on the vertical fin in the second region of the substrate, in accordance with an embodiment of the present invention.

In one or more embodiments, the masking block 200 can be removed from the first region 101 using a selective isotropic etch. Removing the masking block 200 can expose the underlying capping layer segment 192 in the first region 101.

In one or more embodiments, a protective layer 210 can be formed on the capping layer segment 192 in the first region 101 and the gate dielectric layer 170 exposed in the second region 102. The protective layer on the 210 can be formed by a blanket deposition, for example, CVD, PECVD, PVD, or a combination thereof. The protective layer 210 can extend above the top surface of the capping layer segment 192 and vertical fins 112.

In various embodiments, the protective layer on the 210 can be amorphous silicon (a-Si), amorphous carbon (a-C), or a combination thereof.

Figure 10:
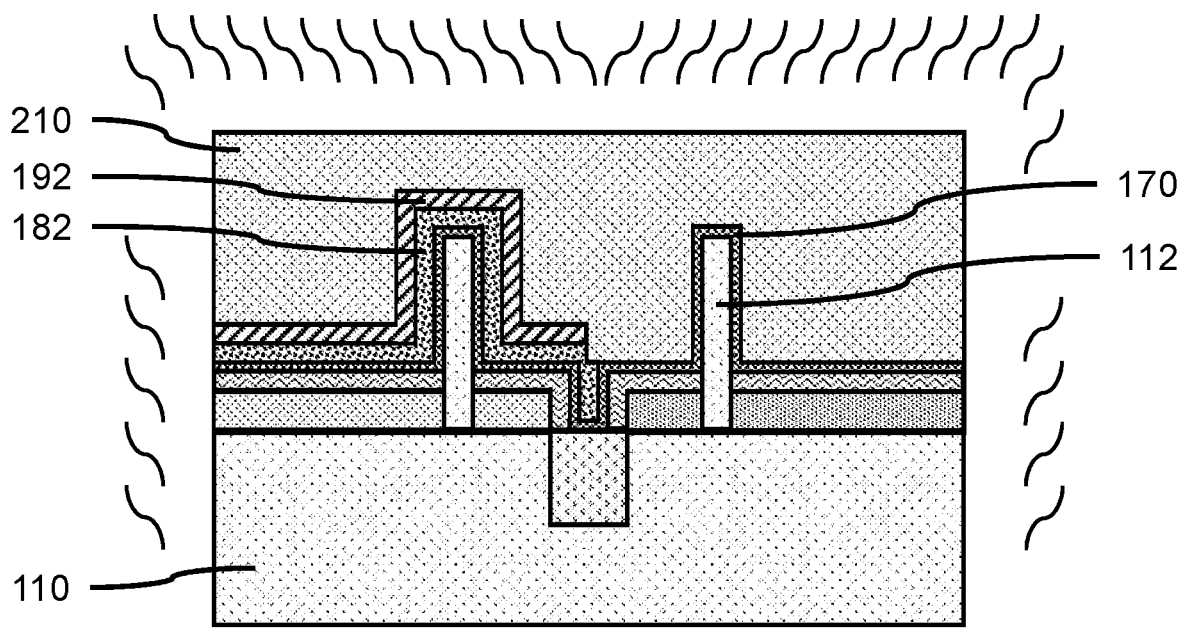
FIG. 10 is a cross-sectional side view showing a heat treatment of the protective layer and vertical fins, and the remaining portion of the capping layer and work function material layer in the first region, in accordance with an embodiment of the present invention.

FIG. 10 is a cross-sectional side view showing a heat treatment of the protective layer and vertical fins, and the remaining portion of the capping layer and work function material layer in the first region, in accordance with an embodiment of the present invention.

In one or more embodiments, the protective layer 210, capping layer segment 192, work function material layer segment 182, gate dielectric layer 170, and vertical fins 112 can be heat treated to modulate the work function of the work function layer, for example, titanium nitride (TiN) towards the value of the conduction band for semiconductor channel, for example, silicon (Si), to achieve a target threshold voltage of an n-type transistor device. In various embodiments, the heat treatment can modify the work function material layer on a vertical fin forming an n-type fin field effect transistor device to form a modified work function material layer segment 185. The modified work function material layer segment 185 can have the work function close to the conduction band edge of Si channel in order to achieve the target threshold voltage of the transistor.

In various embodiments, the heat treatment can change the work function of the work function material layer segment 182 from a range of about 3.5 electron volts (eV) to about 4.1 eV to a range of about 3.8 eV to about 4.1 eV for a modified work function material layer segment 185. In a non-limiting exemplary embodiment, a work function of the work function material layer segment 182 on an n-type FinFET can initially be in a range of about 3.5 electron volts (eV) to about 4.1 eV and shift to a range of about 3.8 eV to about 4.1 eV.

In various embodiments, the heat treatment can be a spike rapid thermal anneal, where the temperature can be ramped up to a peak temperature and ramped down without a duration at a predetermined temperature. In various embodiments, the peak temperature of the spike rapid thermal anneal can be in a range of about 800° C. to about 1100° C., or about 900° C. to about 1000° C., or about 950° C., although other temperatures are also contemplated.

In various embodiments, the heat treatment can be a laser anneal, in which the temperature of the protective layer 210, capping layer segment 192, work function material layer segment 182, and vertical fins 112 can be raised to about 900° C. to about 1200° C., or about 900° C. to about 1000° C. for a duration in a range of about 5 nanoseconds (nSec) to about 5000 nSec, or about 5 nSec to about 1000 nSec, or about 5 nSec to about 500 nSec, although other temperatures and durations are contemplated.

Figure 11:
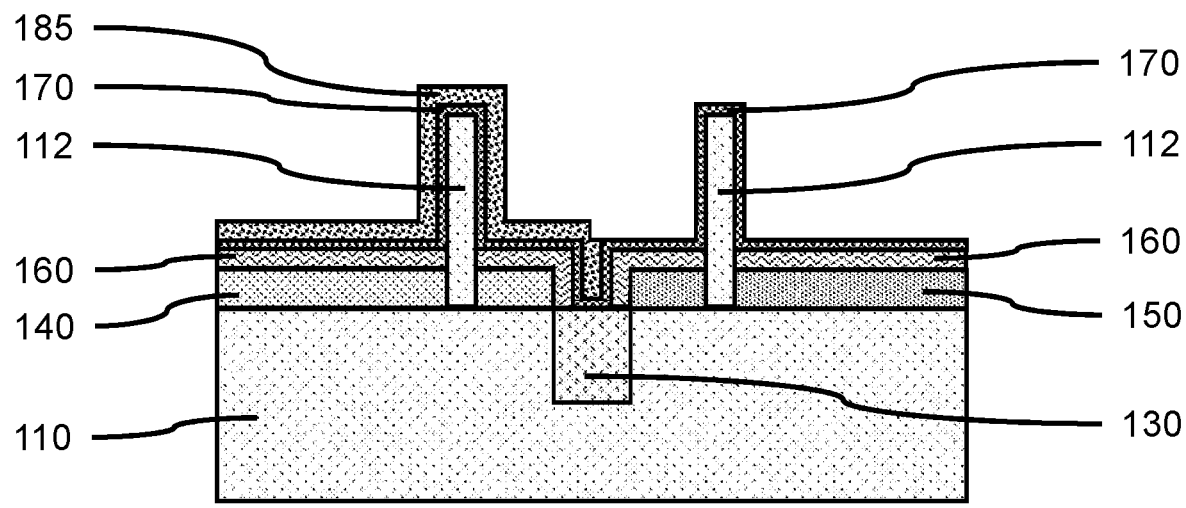
FIG. 11 is a cross-sectional side view showing removal of the protective layer remaining portion of the capping layer to expose the treated work function material layer in the first region, in accordance with an embodiment of the present invention.

FIG. 11 is a cross-sectional side view showing removal of the protective layer remaining portion of the capping layer to expose the treated work function material layer in the first region, in accordance with an embodiment of the present invention.

In one or more embodiments, the protective layer 210 can be removed using an isotropic etch to expose the capping layer segment 192 in a first region 101 and the gate dielectric layer 170 in a second region 102.

In one or more embodiments, the capping layer segment 192 can be removed using an isotropic etch to expose the modified work function material layer segment 185.

Figure 12:
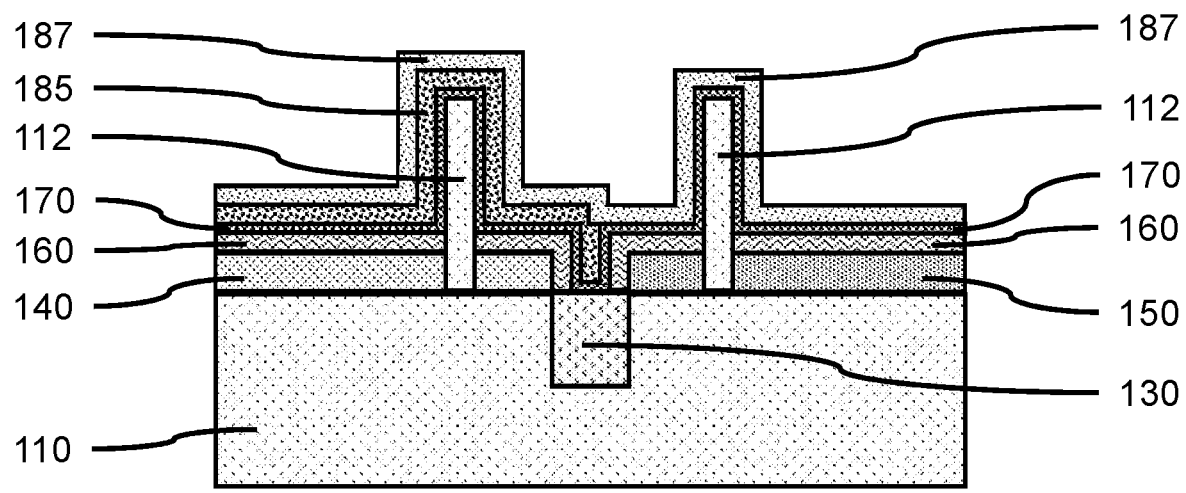
FIG. 12 is a cross-sectional side view showing a second work function material layer formed on the heat treated work function material layer in the first region and the gate dielectric layer on the vertical fin in the second region, in accordance with an embodiment of the present invention.

FIG. 12 is a cross-sectional side view showing a second work function material layer formed on the heat treated work function material layer in the first region and the gate dielectric layer on the vertical fin in the second region, in accordance with an embodiment of the present invention.

In one or more embodiments, a second work function material layer 187 can be formed on the modified work function material layer segment 185 and exposed portions of the gate dielectric layer 170, including on a vertical fin in a second region of the substrate 110, where the second work function material layer 187 can be formed by a conformal deposition (e.g., ALD, PEALD). In a non-limiting exemplary embodiment, a work function of the work function material layer segment 182 on a p-type FinFET can initially be in a range of about 4.5 electron volts (eV) to about 5.0 eV and shift to a range of about 4.8 eV to about 5.1 eV.

In various embodiments, the second work function material layer 187 can have a thickness in a range of about 30 nm to about 100 nm, or about 50 nm to about 70 nm, although other thicknesses are also contemplated.

In one or more embodiments, the second work function material layer 187 can be a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In various embodiments, a conductive material or a combination of multiple conductive materials can serve as both gate conductor and WFM layer. In various embodiments, the second work function material layer 187 can be a different material from the first work function material layer 180.

Figure 13:
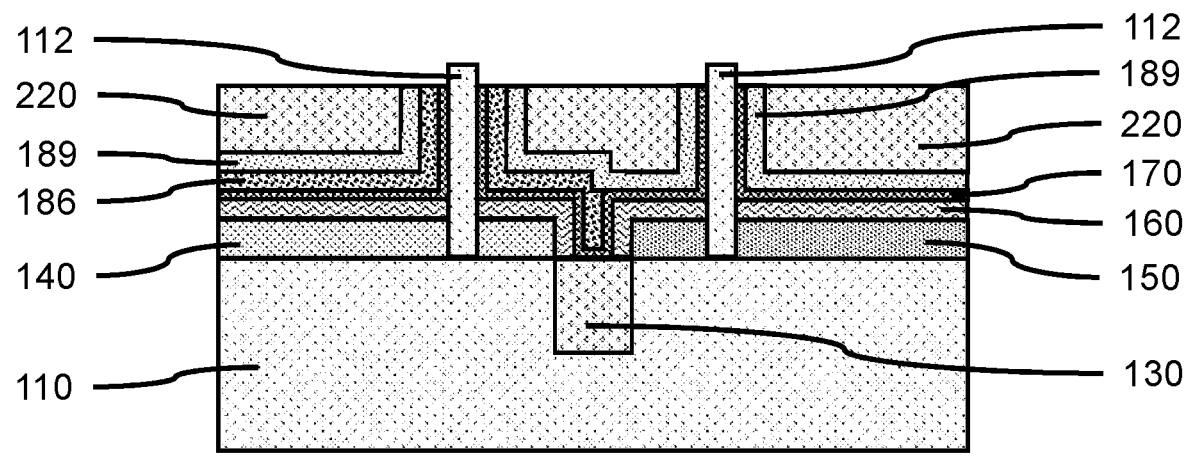
FIG. 13 is a cross-sectional side view showing a reduced fill layer formed on the second work function material layer in the first and second regions, in accordance with an embodiment of the present invention.

FIG. 13 is a cross-sectional side view showing a reduced fill layer formed on the second work function material layer in the first and second regions, in accordance with an embodiment of the present invention.

In one or more embodiments, a fill layer 220 can be formed on the second work function material layer 187, where the fill layer 220 can be formed by a blanket deposition, for example, CVD, PECVD, PVD, flowable oxide, spin-on, or a combination thereof. The fill layer 220 can extend above and cover the top surfaces of the second work function material layer 187.

In various embodiments, the height of the fill layer 220 can be reduced, such that the top surface of the fill layer 220 is below the top surface of the vertical fins 112, where the height of the fill layer 220 can be reduced using an isotropic etch. Reducing the height of fill layer 220 can expose an upper portion of the second work function material layer 187 on the vertical fins 112 in the first region 101 and the second region 102.

In one or more embodiments, the exposed second work function material layer 187 extending above the reduced height fill layer 220 can be removed using a selective, isotropic etch to form a second work function material gate segment 189 and expose the underlying modified work function material layer segment 185 or gate dielectric layer 170 on the upper portion of the vertical fin(s) 112. The exposed portion of the modified work function material layer segment 185 can be removed to form a modified work function material gate segment 186 of a gate structure on the vertical fin 112.

In one or more embodiments, the exposed portions of the gate dielectric layer 170 can be removed using a selective isotropic etch to expose the upper portions of the vertical fins 112.

Figure 14:
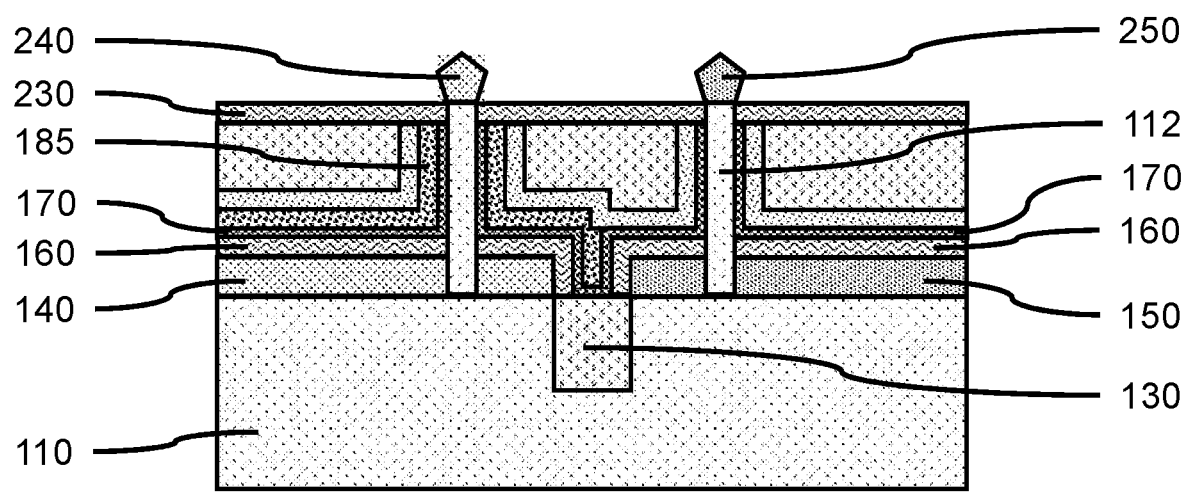
FIG. 14 is a cross-sectional side view showing a top spacer layer formed on the reduced fill layer, and top source/drains formed on the plurality of vertical fins to form vertical fin field effect transistor devices, in accordance with an embodiment of the present invention.

FIG. 14 is a cross-sectional side view showing a top spacer layer formed on the reduced fill layer, and top source/drains formed on the plurality of vertical fins to form vertical fin field effect transistor devices, in accordance with an embodiment of the present invention.

In one or more embodiments, a top spacer layer 230 can be formed on the reduced height fill layer 220, second work function material gate segment 189, modified work function material gate segment 186, gate dielectric layer 170, and vertical fins 112. The top spacer layer 230 can be formed by a directional deposition and etch-back.

In one or more embodiments, the top spacer layer 230 can have a thickness in a range of about 5 nm to about 20 nm, or about 8 nm to about 12 nm, although other thicknesses are also contemplated.

In various embodiments, an upper portion of the vertical fins 112 can extend above the top surface of the top spacer layer 230.

In various embodiments, the upper portion of the vertical fins 112 can be removed to recess the top surface of the vertical fins 112 below the top surface of the top spacer layer 230. The top surface of the vertical fins can be recessed to between the top surface and bottom surface of the top spacer layer 230, or coplanar with the bottom surface of the top spacer layer 230 to provide a sharp interface between a top source/drain and top edge of the gate structure.

In one or more embodiments, an n-doped top source/drain 240 can be formed on a vertical fin 112 that has an n-doped bottom source/drain, and a p-doped top source/drain 250 can be formed on a vertical fin 112 that has a p-doped bottom source/drain.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" "beneath" other elements or features would then be oriented "above" the other elements or features. Thus, the term "below" can encompass both an orientation of above and below. The device can be otherwise oriented (rotated 90 degrees or at other orientations), the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims.

Having thus described aspects of the invention, with the details and particularity required by the patent laws, what is claimed and desired protected by Letters Patent is set forth in the appended claims.

What is claimed is:

1. A method of fabricating a complementary metal-oxide-semiconductor (CMOS) device, comprising:
    forming an n-type bottom source/drain and a p-type bottom source/drain on a substrate;
    forming a work function material layer segment on a gate dielectric layer over a first vertical fin and a bottom spacer layer on the n-type bottom source/drain adjoining the first vertical fin on a first region of the substrate, wherein the gate dielectric layer is also over a second vertical fin and the bottom spacer layer on the p-type bottom source/drain adjoining the second vertical fin on a second region of the substrate, and wherein the bottom spacer layer, the gate dielectric layer, and the work function material layer fill a gap between the n-type bottom source/drain and the p-type bottom source/drain;
    heat treating the work function material layer segment to produce a modified work function material layer segment on the first vertical fin with a shifted work function value;
    forming a second work function material layer on the modified work function material layer segment and the gate dielectric layer on the second vertical fin; and
    growing a top source/drain on each of the first vertical fin and the second vertical fin.

2. The method of claim 1, wherein the heat treating is a spike rapid thermal anneal.

3. The method of claim 2, wherein the spike rapid thermal anneal has a peak temperature in a range of about 800° C. to about 1100° C.

4. The method of claim 1, wherein the heat treating is a laser anneal.

5. The method of claim 1, wherein the work function material layer segment has a thickness in a range of about 3 nm to about 10 nm.

6. The method of claim 1, wherein the work function material layer segment is a work function material selected from the group consisting of titanium nitride (TiN), titanium aluminum nitride (TiAlN), tantalum nitride (TaN), titanium aluminum carbide (TiAlC), and combinations thereof.

7. The method of claim 1, further comprising forming an isolation region in the substrate between the first vertical fin and the second vertical fin, wherein the gap is over the isolation region.

8. The method of claim 7, further comprising forming a reduced height fill layer on the second work function material layer.

9. The method of claim 8, further comprising depositing a top spacer on the reduced height fill layer.

10. A method of fabricating a complementary metal-oxide-semiconductor (CMOS) device, comprising:
    forming an n-type bottom source/drain adjoining a first vertical fin on a first region of a substrate and a p-type bottom source/drain adjoining a second vertical fin on a second region of the substrate, wherein there is an isolation region in the substrate between the first vertical fin and the second vertical fin, and a gap between the n-type bottom source/drain and the p-type bottom source/drain above the isolation region;
    depositing a bottom spacer layer on the n-type bottom source/drain and p-type bottom source/drain by selective deposition, wherein a portion of the bottom spacer layer is in the gap between the n-type bottom source/drain and the p-type bottom source/drain;
    depositing a gate dielectric layer on the bottom spacer layer, first vertical fin, and second vertical fin, wherein a portion of the gate dielectric layer is in the gap;
    forming a work function material layer segment on the first vertical fin and in the gap;

heat treating the work function material layer segment to produce a modified work function material layer segment on the first vertical fin with a shifted work function value;

forming a second work function material layer on the modified work function material layer segment and the gate dielectric layer on the second vertical fin; and growing a top source/drain on each of the first vertical fin and the second vertical fin.

11. The method of claim 10, further comprising forming a reduced height fill layer on the second work function material layer.

12. The method of claim 11, wherein the work function material layer segment is a work function material selected from the group consisting of titanium nitride (TiN), titanium aluminum nitride (TiAlN), tantalum nitride (TaN titanium carbide (TiC), titanium aluminum carbide (TiAlC), and combinations thereof.

13. The method of claim 12, wherein the heat treatment is a spike rapid thermal anneal that has a peak temperature in a range of about 800° C. to about 1100° C.

14. The method of claim 12, wherein the modified work function material layer segment has a work function in a range of about 3.8 electron volts (eV) to about 4.1 eV.

15. The method of claim 14, wherein the second work function material layer is a work function material selected from the group consisting of titanium nitride (TiN), titanium aluminum nitride (TiAlN), tantalum nitride (TaN), tantalum silicon nitride (TaSiN), titanium carbide (TiC), titanium aluminum carbide (TiAlC), and combinations thereof.

* * * * *